US009470746B2

(12) United States Patent
Munson et al.

(10) Patent No.: US 9,470,746 B2
(45) Date of Patent: Oct. 18, 2016

(54) ENVIRONMENTAL SENSOR

(71) Applicant: Foresite, Inc., Kokomo, IN (US)

(72) Inventors: Terry L. Munson, Kokomo, IN (US);
Jason Hultman, Westfield, IN (US);
Steve Ring, Carmel, IN (US)

(73) Assignee: Foresite, Inc., Kokomo, IN (US)

( * ) Notice: Subject to any disclaimer, the term of this patent is extended or adjusted under 35 U.S.C. 154(b) by 586 days.

(21) Appl. No.: 14/096,095

(22) Filed: Dec. 4, 2013

(65) Prior Publication Data
US 2014/0152333 A1 Jun. 5, 2014

Related U.S. Application Data

(60) Provisional application No. 61/732,968, filed on Dec. 4, 2012.

(51) Int. Cl.
*G01R 31/00* (2006.01)
*G01R 31/28* (2006.01)

(52) U.S. Cl.
CPC .................. *G01R 31/2817* (2013.01)

(58) Field of Classification Search
CPC .................................. G01R 31/2817
See application file for complete search history.

(56) References Cited

U.S. PATENT DOCUMENTS 5,307,018 A * 4/1994 Gadgil ............... G01R 31/2849
324/537
6,997,043 B2 * 2/2006 Swanson ................ G01N 25/56
361/679.01

* cited by examiner

*Primary Examiner* — Daniel Miller
(74) *Attorney, Agent, or Firm* — Woodard Emhardt Moriarty McNett & Henry LLP

(57) ABSTRACT

A device for monitoring a working environment in which electronic circuit boards are present includes: a) test circuit boards with pairs of traces and circuitry for determining the electrical resistance between the traces, the test boards being positioned in a pathway effective for directing air across the test traces; b) control elements for controlling the flow of air through the pathway and for controlling power applied to the test board traces; c) data storage for storing data relating to acceptable electrical resistance between test traces; d) circuitry for comparing measured electrical resistance between two test traces to a stored value for the acceptable electrical resistance between two test traces; and e) an output for communicating the results of the comparison between the measured electrical resistance between two test traces and the stored value for the acceptable electrical resistance between two test traces.

6 Claims, 11 Drawing Sheets

ENVIRONMENTAL SENSOR

CROSS-REFERENCE TO RELATED APPLICATIONS

This application claims the benefit of U.S. Provisional Application No. 61/732,968, filed Dec. 4, 2012, the entire contents of which are hereby incorporated herein by reference.

FIELD OF THE INVENTION

The present invention relates generally to devices and methods for evaluating microelectronic processing methods and conditions, and more particularly to methods for evaluating the failure rate of microelectronic components processed by a selected processing method and exposed to a selected environmental gas such as the air in a work environment.

BACKGROUND TO THE INVENTION

The assembly and use of microelectronic devices generally takes place in an environment that must be clean and non-corrosive to the devices being assembled and/or used there. When the environment is not clean, the microelectronic devices present in the room may fail. This adds significant cost in materials and time, and may compromise device reliability.

Examples of the causes of failures that have been observed for microelectronic components are: 1) tin whiskers such as from plating and/or solder stresses; 2) creep corrosion from copper sulfide crystals growing radially on a component; 3) electrochemical migration such as dendrite growth; 4) parasitic leakage that may cause a reduction in resistance without a visible short; 5) airborne metal particles such as zinc whiskers; and 6) small airborne particles such as smoke.

There is a need for a way to test microelectronic processing systems, components, and environments to determine whether a process and/or its components may experience unacceptable failure rates when the process is performed in a specific work environment or when the components are exposed to an environmental gas such as the air in a work environment. The present invention addresses that need.

SUMMARY OF THE INVENTION

Briefly describing one aspect of the present invention, there is provided a device for monitoring a working environment in which circuit board assemblies are manufactured or used. In one aspect the device comprises:

a) a test probe comprising a pair of traces and circuitry effective for determining the electrical resistance between the traces;

b) a test probe socket assembly for holding one or more of the test probes so that the traces are positioned in an air flow pathway, and for connecting the test probe(s) to a source of power and to circuitry for storing and/or analyzing data;

c) an enclosed pathway for directing environmental air across the traces of a test probe;

d) a fan for moving environmental air through the enclosed pathway and across said test probe;

e) a control element for controlling a fan to selectively blow or not blow air through the enclosed pathway and across the test probe(s);

f) a control element for controlling power applied to one or more of the test probe traces;

g) resistance analysis circuitry including data storage for storing data relating to acceptable electrical resistance between test probe traces and for comparing measured electrical resistance between two test probe traces to that stored data; and h) an output for communicating the results of the resistance comparison.

In one embodiment the test probe(s) include resistance to square wave circuitry effective to convert a measured electrical resistance to digital output data representing the measured resistance.

In one embodiment the test probe has a connection end with a keyed connector that may be inserted into said test probe socket only in an orientation that allows proper communication between the test probe and the control system.

In one embodiment the device also includes a base probe with a pair of traces that are located outside of the enclosed pathway so that environmental air is not moved across the second pair of traces when the fan blows. The base probe traces are connected to a source of power and to circuitry for storing and/or analyzing data, with the source of power and the circuitry for storing and/or analyzing data preferably being the same as the source of power and the circuitry for storing and/or analyzing data associated with the test traces.

The device may further include a transmitter to transmit to a remote location a signal indicating test trace leakage. One or more status indicators to indicate the current status of the device may also be included. Various connectors for connecting the device to test and/or analytical equipment may also be included.

In another embodiment of the present invention there is provided a method for detecting whether an environment will contribute to the failure of electronic circuit boards. That method may include the steps of:

a) providing a test probe comprising a pair of traces and circuitry effective for determining the electrical resistance between the traces;

b) optionally exposing the test probe to environmental air to be tested;

c) measuring the electrical resistance between the traces at a first test probe measurement time;

d) communicating information relating to the measured electrical resistance between the two traces of the test probe as measured at the first test probe measurement time to circuitry that stores and/or analyzes data;

e) confirming that the measured electrical resistance between the two traces of the test probe as measured at the first test probe measurement time is at an acceptable level as defined by a pre-determined acceptance standard;

f) exposing or continuing to expose the test probe to environmental air to be tested;

g) making one or more subsequent measurements of the electrical resistance between the two traces of the test probe after exposure of the test probe to environmental air;

h) communicating information relating to the one or more subsequent measurements to circuitry that stores and/or analyzes data;

i) determining when the measured electrical resistance between the two traces of the test probe changes to an unacceptable level as defined by a pre-determined acceptance standard; and j) optionally outputting information or a signal indicating that the measured electrical resistance between the two traces of the test probe is at an unacceptable level as defined by a pre-determined acceptance standard.

In one embodiment the method further comprises the step of evaluating changes in the electrical resistance between the two test probe traces over an exposure period.

In one embodiment the inventive method additionally uses a base probe with a pair of traces and circuitry effective for determining the electrical resistance between said traces, wherein the base probe traces are located outside of the enclosed pathway so that environmental air is not moved across the second pair of traces when the fan blows. In that embodiment the method may further include the steps of: a) measuring the electrical resistance between the two traces of the base probe at a first base probe measurement time, wherein said first base probe measurement time may be the same time or a different time than the first test probe measurement time; b) communicating information relating to the measured electrical resistance between the two traces of the base probe as measured at the first base probe measurement time to circuitry that stores and/or analyzes data; c) confirming that the measured electrical resistance between the two traces of the base probe as measured at the first base probe measurement time is at an acceptable level as defined by a pre-determined acceptance standard; d) making one or more subsequent measurements of the electrical resistance between the two traces of the base probe; e) communicating information relating to the one or more subsequent measurements to circuitry that stores and/or analyzes data; and optionally f) using the measured electrical resistance between the two traces of the base probe as a baseline for evaluating the performance of the materials and/or methods used to build and/or process and/or use a circuit board.

DESCRIPTION OF THE PREFERRED EMBODIMENTS

Figure 1:
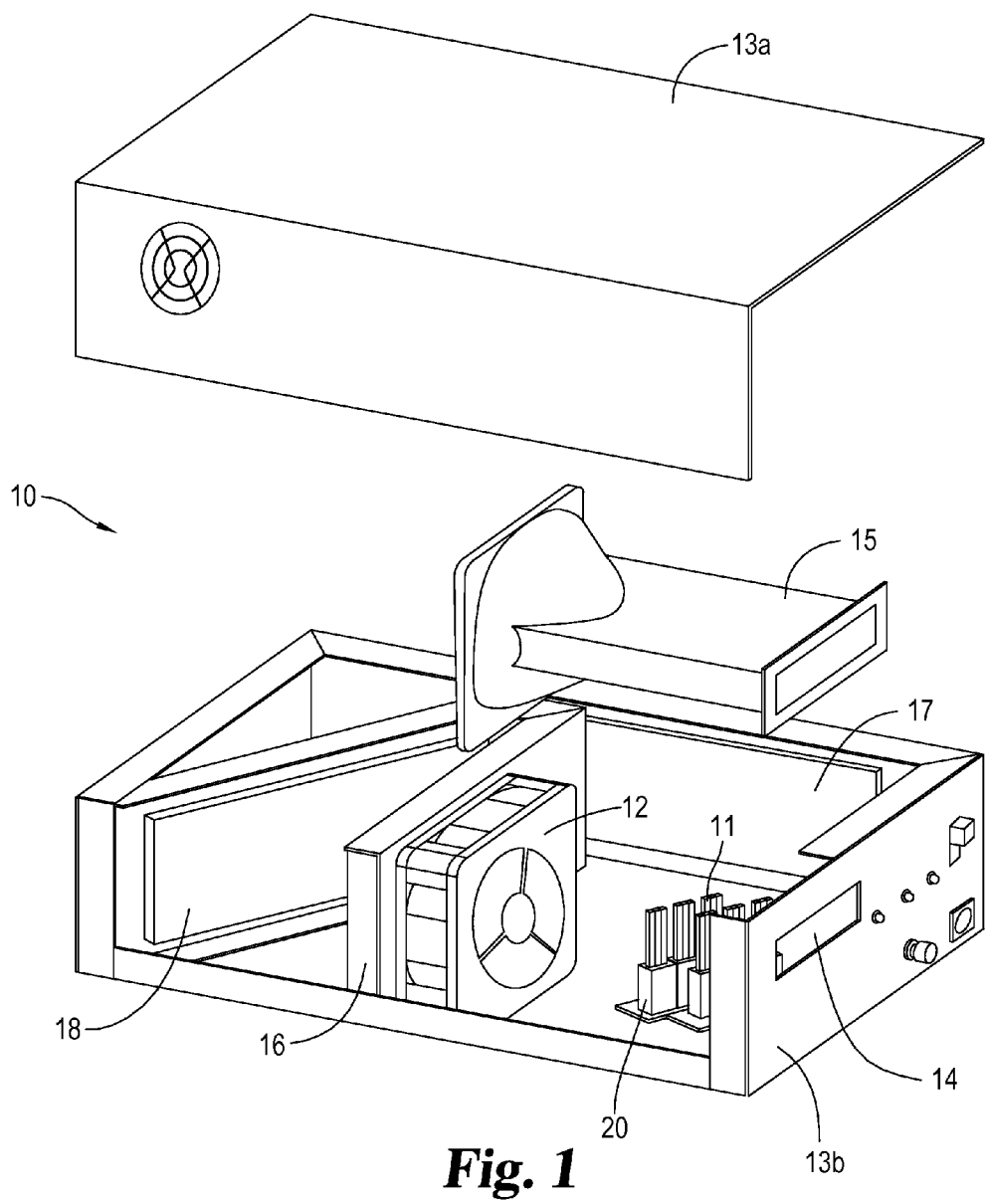
FIG. 1 is a partially "exploded" view of various components of one embodiment of the present invention.

For the purposes of promoting an understanding of the principles of the invention, reference will now be made to certain preferred embodiments and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

One aspect of the present invention relates to a device for monitoring an environment in which electronic circuit board assemblies are processed and/or located, and/or for evaluating the compatibility of electronic components and/or processes with the "air" in a working or processing environment. In one aspect the device comprises:

a) a test probe comprising a pair of traces and circuitry effective for determining the electrical resistance between said traces;

b) a test probe socket assembly for holding one or more of the test probes so that the traces are positioned in an air flow pathway, and for connecting the test probe(s) to a source of power and to circuitry for storing and/or analyzing data;

c) an enclosed pathway for directing environmental air across the traces of the test probe(s);

d) a fan for moving environmental air through the enclosed pathway and across the test probe(s);

e) a control element for controlling a fan to selectively blow or not blow air through the enclosed pathway and across the test probe(s);

f) a control element for controlling power applied to one or more of the test probe traces;

g) resistance analysis circuitry including data storage for storing data relating to acceptable electrical resistance between test probe traces and for comparing measured electrical resistance between two test probe traces to that stored data; and h) an output for communicating the results of the comparison between the measured electrical resistance between two test probe traces and the stored value for the acceptable electrical resistance between two test probe traces.

In another aspect the device comprises:

a) an enclosed pathway for directing environmental air;

b) a fan for moving environmental air through the enclosed pathway;

c) one or more test probes comprising a pair of traces and circuitry effective for determining the electrical resistance between said traces, wherein the test probes are positioned in the enclosed pathway such that the traces are exposed to environmental air flowing through the pathway;

d) a control element for controlling a fan to selectively blow or not blow air through the enclosed pathway and across the test probe(s);

e) a control element for controlling power applied to one or more of the test probe traces;

f) resistance analysis circuitry including data storage for storing data relating to acceptable electrical resistance between test probe traces and for comparing measured electrical resistance between two test probe traces to that stored data; and g) an output for communicating the results of the comparison between the measured electrical resistance between two test probe traces and the stored value for the acceptable electrical resistance between two test probe traces.

In one embodiment the test probe includes resistance to square wave circuitry to convert a measured electrical resistance to digital output data representing the measured resistance.

In one embodiment the test probe has a connection end with a "keyed" connector that may be inserted into the device test probe socket only in an orientation that allows proper communication between the test probe and the control system.

More particularly describing certain aspects of the present invention, in one preferred embodiment the inventive device includes: a) an air flow path; b) a fan for blowing air across the air flow path; c) test probes positioned in the air flow path; d) a main board with circuitry for controlling the device; e) sockets for releasably holding test probes in the air flow path and for connecting the test probes to flex circuit connectors that link the test probes to the main board; f) flex circuit connectors for connecting test probe sockets to the main board; g) power for powering the test probes and the fan and the main board; h) a switch for turning the device on or off; i) one or more connectors for connecting the device to an external device; j) visual or audible indicators of the status of an observed event; k) a filter to collect small contamination particles from the air flow path; and l) a housing for protecting the components.

In another embodiment the device may include:
 a) a fan for blowing or drawing environmental air in a fan air path;
 b) a test probe positioned in said fan air path, with the test probe comprising two or more test traces that are spaced a test distance apart, wherein the test distance is between 5 mils and 50 mils;
 c) electronics for one or more of: i) controlling power to the test probe, ii) controlling power to the fan, iii) detecting the electrical resistance between test traces when power is applied to the traces, iv) comparing a detected electrical resistance to a pre-selected standard; and v) outputting information indicating whether a detected electrical resistance is above, at, or below a pre-selected standard.

The preferred device also may include:
 d) at least one power supply to supply power to the test probe and to the controller; and
 e) a housing for holding the test probe(s) in the fan air path and for holding circuitry to connect the test board(s) to the controller, and for containing the controller, fan and filter.

More particularly describing the test probes of the inventive device, preferred test probes are mini-circuit boards with a length between one and two inches and a width between ¼ inch and ½ inch. Such test probes preferably include: a) a pair of traces that are spaced a fixed, test distance apart; b) a connector end with leads to connect to a connection socket and a "key" to make sure the connector is inserted correctly into the connection socket; and c) resistance to square wave circuitry to convert a measured resistance to a digital signal that represents the resistance. In some embodiments the probe may include additional circuitry such as a voltage regulator for controlling the voltage of electric power provided to the test traces, and in some embodiments the probe/board may include a data storage device.

The pair of traces provided on a test probe are spaced a test distance apart, wherein said test distance is between 5 mils and 50 mils. In one embodiment the test distance is no more than about 5 mils. In another embodiment the test distance is no more than about 10 mils. In another embodiment the test distance is no more than about 15 mils. In another embodiment the test distance is no more than about 20 mils. In another embodiment the test distance is no more than about 25 mils. In another embodiment the test distance is no more than about 30 mils. In another embodiment the test distance is no more than about 35 mils. In another embodiment the test distance is no more than about 40 mils. In another embodiment the test distance is no more than about 45 mils. In another embodiment the test distance is no more than about 50 mils. In some embodiments a test probe may include more than one test circuit.

The inventive device may use one test probe or multiple test probes. When multiple test probes are used the probes may all be substantially the same, with each probe having test traces that are spaced apart by the same test distance, or the probes may be different, with the various probes having test traces that are spaced apart by differing test distances. Any combination of test probes may be used to test a variety of test distances that may be the same or different.

The keyed connector assures that a test probe is inserted correctly into a probe socket. The keyed connector accordingly ensures that a test probe may be inserted into a corresponding test probe socket only in an orientation that allows proper communication between the test probe and the control system. In one embodiment the keyed connector includes a notch that matches a tab in a socket so that the test probe cannot be inserted into the socket except with the notch matching up with the tab.

Resistance to square wave circuitry may be used to assist in measuring and communicating the resistance between the test traces. When power is applied to a set of parallel test traces, the probe circuitry converts the resistance between the traces into a square wave with a period proportional to the resistance. In other words, the probe leads are turned into a simple oscillator using the probe resistance to control the period. This allows a user simply to measure the time instead of reading the resistance directly. The signal is conditioned by an inverter that gives a clean digital signal. The period of the signal is measured, and this period is directly proportional to the resistance between the traces. When the resistance is compromised, contamination between the test traces is indicated. This may indicate that the environment is not suitable for making or using circuits having traces of a similar pitch, and/or it may indicate that the method and/or materials used to process the test probe is/are not suitable for a desired application.

The test probes are preferably held by test probe connection assemblies that connect the test probe(s) to the control and analysis circuitry. The test probe connection assemblies may have one or more sockets for receiving test probes, and a flex circuit connector for connecting the socket to the control and analysis circuitry. The sockets preferably are "keyed" to match corresponding keys on the test probes so that a test probe may only be inserted into a socket in the correct orientation. The flex circuit connector is effective for providing power to the test probe and for communicating resistance information from the test probe to the control and analysis circuitry. The test probe connection assemblies hold the test probes such that the traces of the test probes are position in the air flow passageway through which environmental air is passed. The sockets allow test probe circuit boards to quickly and easily be snapped in and connected to power and control circuitry. This "plug-and-play" feature makes changing and/or adding test circuit boards more efficient.

The air flow pathway of the inventive device is preferably a passageway that is substantially enclosed to direct a flow of air (or other gas) across the test probes while preventing the air from flowing over the other components of the device, and particularly prevents the air from flowing over the control electronics and, if provided, base probe. The air flow pathway includes an air inlet and an air outlet, with a duct connecting the two and providing a substantially enclosed pathway through which a flow of air may be directed. Openings in the duct provide a space for one end of test probes to be inserted into the duct. A light may be provided in the duct to allow an observer to see into the duct.

A fan may be used to blow air through the duct, with the fan being provided at the duct air intake end or, more preferably, at the duct air output end. A filter or other contamination collector may be provided in the air flow pathway. The filter may be used to collect small solid or liquid particles from the air that has been blown across the test board. Once collected, the small particles may be analyzed qualitatively and/or quantitatively to determine their composition and/or amount. In one embodiment the filter may comprise an Empore™ solid phase extraction membrane.

The control and analysis circuitry of the inventive device preferably includes: a) a control element for controlling a fan to selectively blow or not blow air through the enclosed pathway and across the test probe(s); b) a control element for controlling power applied to one or more of the test probe traces; c) resistance analysis circuitry including data storage for storing data relating to acceptable electrical resistance between test probe traces and for comparing measured electrical resistance between two test probe traces to that stored data; and d) an output for communicating the results of the comparison between the measured electrical resistance between two test probe traces and the stored value for the acceptable electrical resistance between two test probe traces.

In one embodiment the control and analysis circuitry is provided on a main board that preferably includes: a) connectors for receiving one end of the flex circuit connectors that are used to link an external probe to the board; b) one or more base/onboard probes with traces separated by a test distance; c) circuitry for controlling a flow of power to one or more external probes and/or to one or more base/onboard probes; d) circuitry for controlling the operation of a fan that may blow or draw air across an air flow path; e) memory for storing information relating to electrical resistance standards which may be the acceptable level of electrical resistance between test traces; f) circuitry for comparing an observed electrical resistance level to a stored electrical resistance standard; g) circuitry for outputting information regarding whether an observed electrical resistance is above, at, or below a stored resistance standard; h) circuitry for determining the time and/or date of an action being processed by the board; i) memory for storing observed electrical resistance levels and/or time and/or date values corresponding to those levels; and j) memory for storing information regarding whether an observed electrical resistance is above, at, or below a stored resistance standard. In some embodiments the control and analysis circuitry may include additional circuitry such as a voltage regulator for controlling the voltage of electric power provided to the test traces.

The control circuitry typically includes a microcontroller that controls all operations on the board and runs the main application that takes care of the periodic probe measurements, fan on/off, LED/buzzer control, and battery level monitoring. The control circuitry may also include circuitry for transmitting and/or activating a signal in response to the detection of current flowing between the test traces when a voltage is applied.

In some embodiments the device further includes a second circuit board processed by a method to be evaluated, wherein the second circuit board comprises a pair of traces and circuitry effective for determining the electrical resistance between said traces, wherein the traces are separated by a test distance, and wherein the second circuit board is located at a location that is remote from said pathway for directing environmental air across the traces of said test probe. The second circuit board may be referred to as a base probe or an onboard probe, and may be provided on the control circuitry board. The onboard probes may be similar to or substantially the same as the external probes, but typically do not have an EEPROM device.

In another embodiment the control and analysis circuitry is provided on a control circuitry board that includes one or more of:
  a) control circuitry for controlling the operation of the fan;
  b) control circuitry for controlling the application of a voltage to one or more test boards;
  c) control circuitry for detecting leakage between test traces when a voltage is applied to the traces;
  d) control circuitry for activating a signal in response to the detection of leakage between test traces when a voltage is applied to the traces;
  e) external probe connectors for connecting the control circuitry to one or more test boards;
  f) one or more onboard probes comprising traces that are spaced a test distance apart, with the test distance matching the test distance of one or more test probes;
  g) a power supply for supplying power to the control circuitry and/or to the test board(s); and
  h) a battery charger.

The output from the device may be delivered as data for observation and/or analysis. Additionally or alternatively, the output may be linked to a signal such as a visible or audible signal that indicates whether a test probe has "failed" by having the measured resistance fall below an acceptable level. The output may also be provided to a data recorder that records information relating to the application of a voltage to the test traces and the detection of current flowing between the test traces when said voltage is applied. One or more status indicators may be provided to indicate the current status of the device.

A source of power, such as a battery, is also preferably included. In some embodiments the power supply may include a 5V power supply. The 5V supply is a boost type that ups the battery voltage to 5V, and may be used to power the fan and LED illuminator. Alternatively, the power source may be a DC battery, or a solar panel, or an AC power connection.

An RF transceiver may be used to transmit data between boards or to a base station. It operates in the 433 Mhz band and uses an external antenna.

A 2.5V regulator may be used to power the micro and RF transceiver. The addition of the 2.5V regulator allows the elimination of two level shifters when the RF transceiver, micro, and probe oscillation signals are all 2.5V.

The LEDs, buzzer, DC jack, and switches may be provided on the main board, or they may be provided elsewhere in the device. Connections may be made through a main 16 pin connector that takes care of LEDs, buzzer, switches, a 2 pin connector for the DC power from an external source, a 4 pin connector for the battery and battery temperature sensor, and a U.FL connector for the external antenna.

An EEPROM may be used to store the probe readings so that the readings will always follow that probe. The readings are provided by the mainboard microcontroller. The probe itself preferably has no way of accessing the EEPROM directly.

The components of the device are preferably contained in a housing. The housing protects the components and may isolate certain elements, such as the base probes, from other elements, such as the test probes. Connectors may be used to connect the device to external components that communicate with the device.

A second aspect of the present invention provides a method for evaluating whether the components and/or methods used to assemble and/or process an electronic circuit board are compromised by exposure to the "air" in a particular environment. That method may include the steps of:

a) providing a test probe comprising a pair of traces and circuitry effective for determining the electrical resistance between the traces;

b) optionally exposing the test probe to environmental air to be tested;

c) measuring the electrical resistance between the traces at a first test probe measurement time;

d) communicating information relating to the measured electrical resistance between the two traces of the test probe as measured at the first test probe measurement time to circuitry that stores and/or analyzes data;

e) confirming that the measured electrical resistance between the two traces of the test probe as measured at the first test probe measurement time is at an acceptable level as defined by a pre-determined acceptance standard;

f) exposing or continuing to expose the test probe to environmental air to be tested;

g) making one or more subsequent measurements of the electrical resistance between the two traces of the test probe after exposure of the test probe to environmental air;

h) communicating information relating to the one or more subsequent measurements to circuitry that stores and/or analyzes data;

i) determining when the measured electrical resistance between the two traces of the test probe changes to an unacceptable level as defined by a pre-determined acceptance standard; and j) optionally outputting information or a signal indicating that the measured electrical resistance between the two traces of the test probe is at an unacceptable level as defined by a pre-determined acceptance standard.

In one embodiment the method further comprises the step of evaluating changes in the electrical resistance between the two test probe traces over an exposure period.

In one embodiment the inventive method additionally uses a base probe with a pair of traces and circuitry effective for determining the electrical resistance between said traces, wherein the base probe traces are located outside of the enclosed pathway so that environmental air is not moved across the second pair of traces when the fan blows. In that embodiment the method may further include the steps of: a) measuring the electrical resistance between the two traces of the base probe at a first base probe measurement time, wherein said first base probe measurement time may be the same time or a different time than the first test probe measurement time; b) communicating information relating to the measured electrical resistance between the two traces of the base probe as measured at the first base probe measurement time to circuitry that stores and/or analyzes data; c) confirming that the measured electrical resistance between the two traces of the base probe as measured at the first base probe measurement time is at an acceptable level as defined by a pre-determined acceptance standard; d) making one or more subsequent measurements of the electrical resistance between the two traces of the base probe; e) communicating information relating to the one or more subsequent measurements to circuitry that stores and/or analyzes data; and optionally f) using the measured electrical resistance between the two traces of the base probe as a baseline for evaluating the performance of the materials and/or methods used to build and/or process and/or use a circuit board.

As indicated by the above, the environmental monitor of the present invention finds particular use in monitoring the air in a space in which electronic circuit boards and/or assemblies are made or used. Such circuit boards may contain fine pitch traces with spacing that is only tenths of a millimeter apart. The air in the workspace may contain compounds that compromise the reliability, durability, and/or performance of the circuits. The inventive device blows or draws the air across a test circuit board and monitors the circuit board to detect when current leaks across the space between the test traces occurs. When leakage occurs (as evidenced by a change in the resistance between the traces), the device detects the leakage and activates a signal, which may be audible and/or visible and/or local and/or remote. The device may also store data relating to the application of a voltage to the test traces and the detection of current flowing between the test traces when said voltage is applied The disclosed methods and device refer to "air" in an environmental workspace. For the purposes of this disclosure the term "air" in intended to mean any gas or mixture of gases, and which may include solid or liquid particles dispersed in the gas. In some embodiments the "air" is a particular gas that a user desires to assess for compatibility with particular components or processes. In other embodiments the "air" is simply the air in a workspace, with that air including whatever gases and/or vapors and/or liquid and/or solid particles that may be present.

In one method of use power is supplied to the test board, readings are taken and converted in real time during the power application and stored in the EEPROM, and then the control electronics interrogate the EEPROM, downloading the data. In other embodiments the control electronics (microcontroller) turns a single probe's power on, takes readings in realtime, converts them, and then writes the value to the EEPROM located on that probe. The microcontroller also has its own built-in EEPROM that can store most recent probe values, or other information if needed.

Typical power requirements are: 2.5V—Microcontroller, RF Transceiver, Probe return signal; 5V—Fan, Illuminator LED. Typical battery voltage can range from 3.2V to 4.2V. The battery may be used to power the indicator LEDs, a buzzer, the test probes, the probe EEPROM, a 2.5V regulator, and a 5V regulator.

Figure 2:
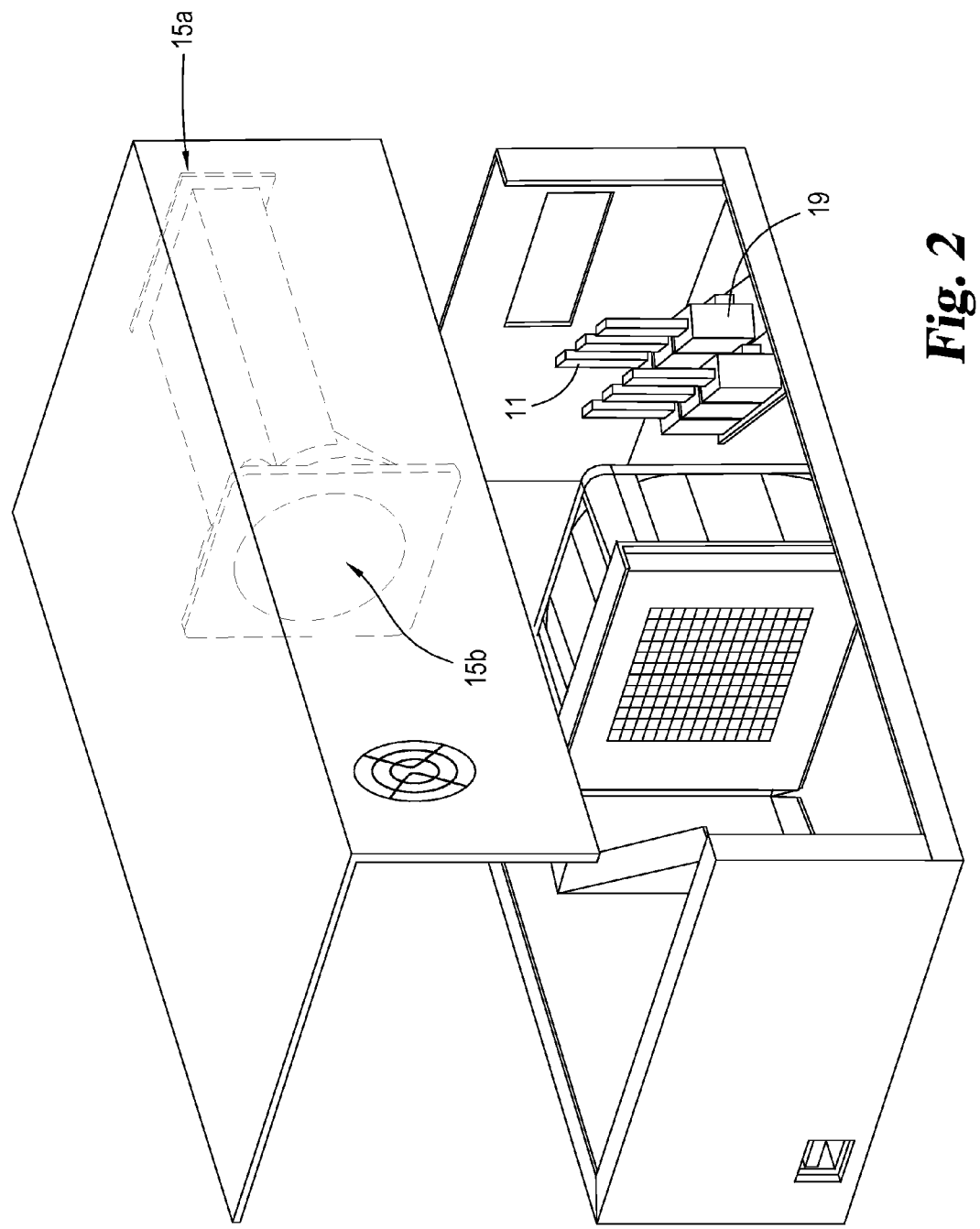
FIG. 2 is a perspective view of various components of one embodiment of the present invention.

Referring to the drawings, FIGS. 1 and 2 are partially "exploded" views of various components of one embodiment of the present invention. The illustrated environmental sensor device 10 includes test probes 11, fan 12, upper housing 13a and lower housing 13b, opening 14 in the housing, air passageway duct 15, filter 16, main board 17, battery 18, and probe socket assembly 19.

Figure 3:
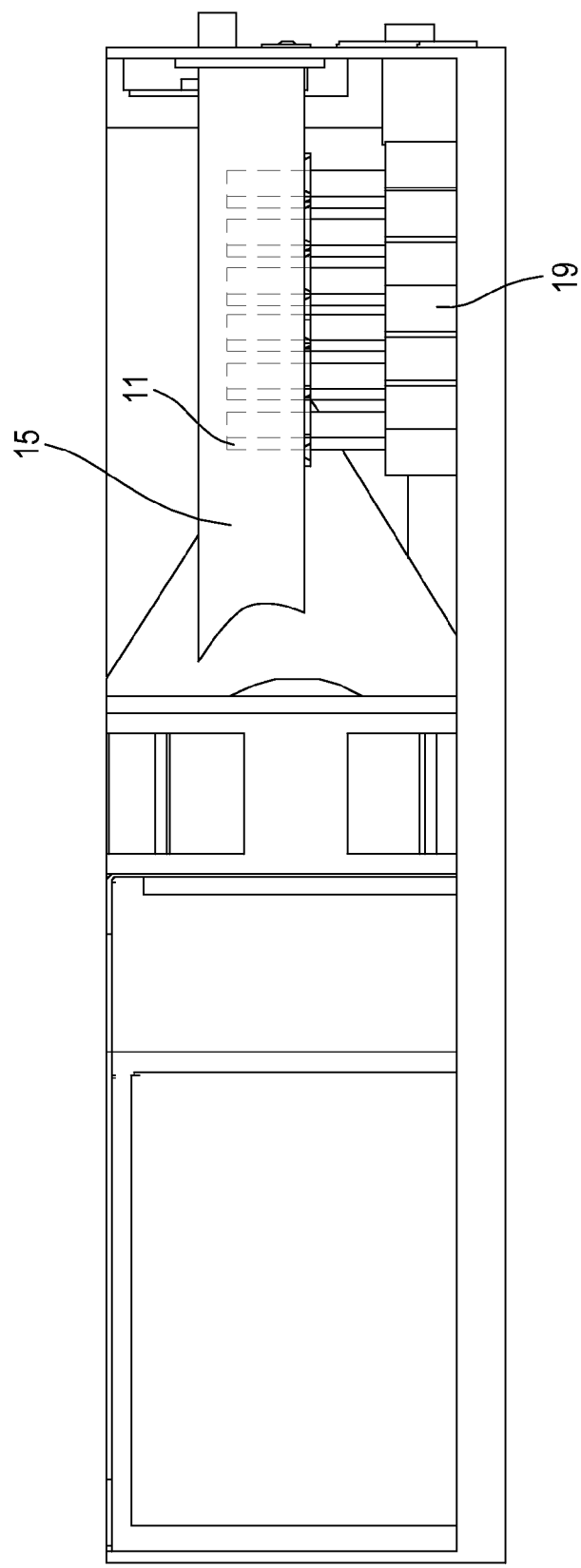
FIG. 3 is a side elevational view of various components of one embodiment of the present invention.

FIG. 3 is a side elevational view of various components of one embodiment of the present invention. Test probes 11 are positioned in air passageway 15 so that the traces are exposed to air flowing through the passageway.

Figure 4:
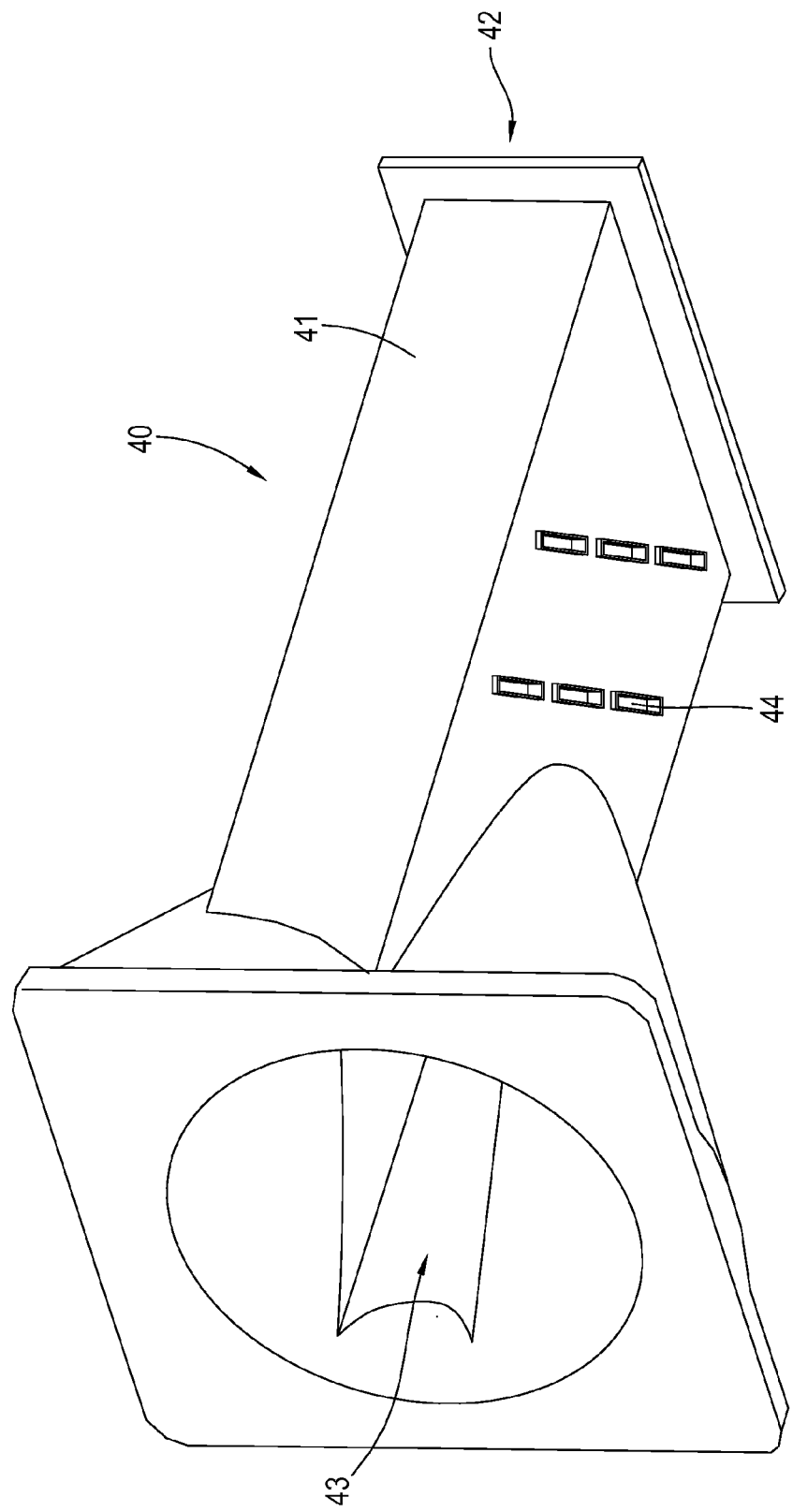
FIG. 4 is perspective view of the air flow assembly of one embodiment of the present invention.

FIG. 4 is perspective view of the air flow assembly of one embodiment of the present invention. The illustrated air flow assembly 40 includes air flow duct 41, duct air intake opening 42, duct air output opening 43, and probe openings 44. Light 45, fan 46, filter/contaminant collection device 47, housing intake opening 48, and housing airflow output opening 49 may also be provided, and are illustrated in other Figures.

Figure 5:
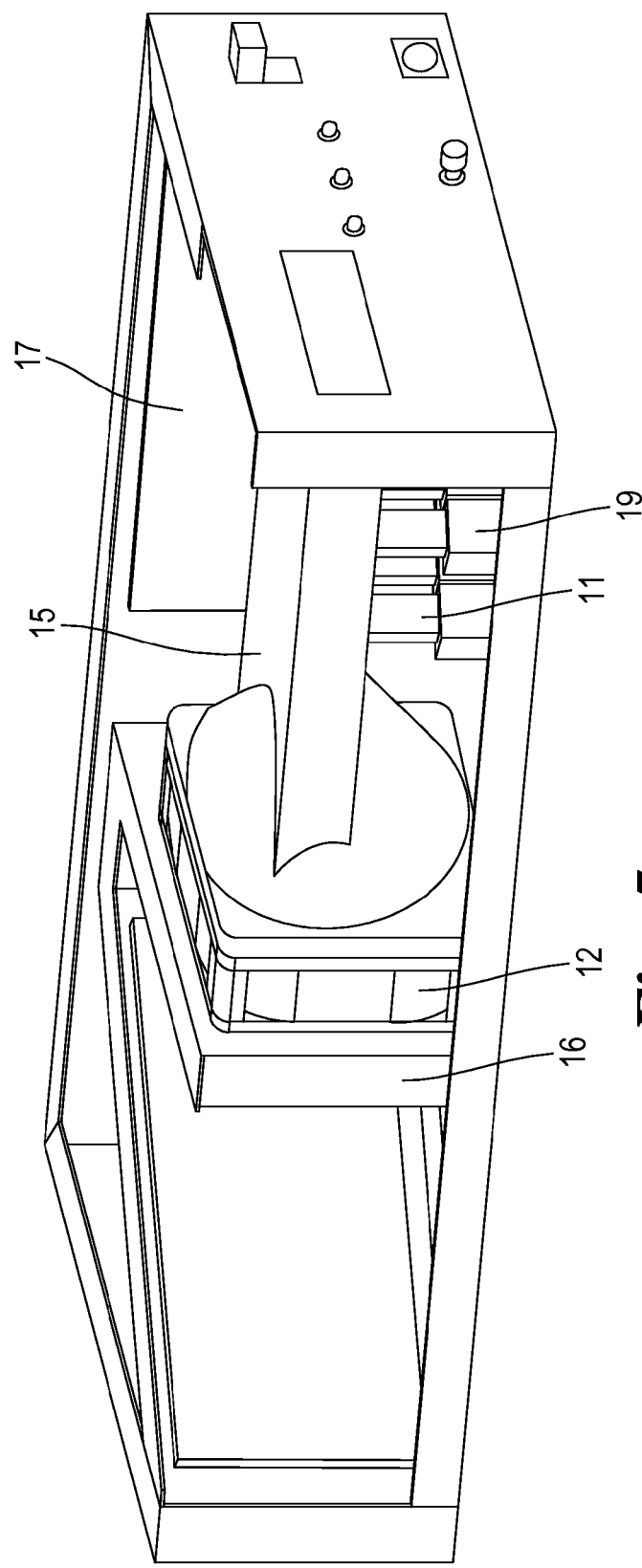
FIG. 5 is a perspective view of various components of one embodiment of the present invention.

FIG. 5 is a perspective view of air flow assembly 40 positioned in device 10 with test probes 11 positioned so that their traces are exposed to air flowing through duct 15.

Figure 6:
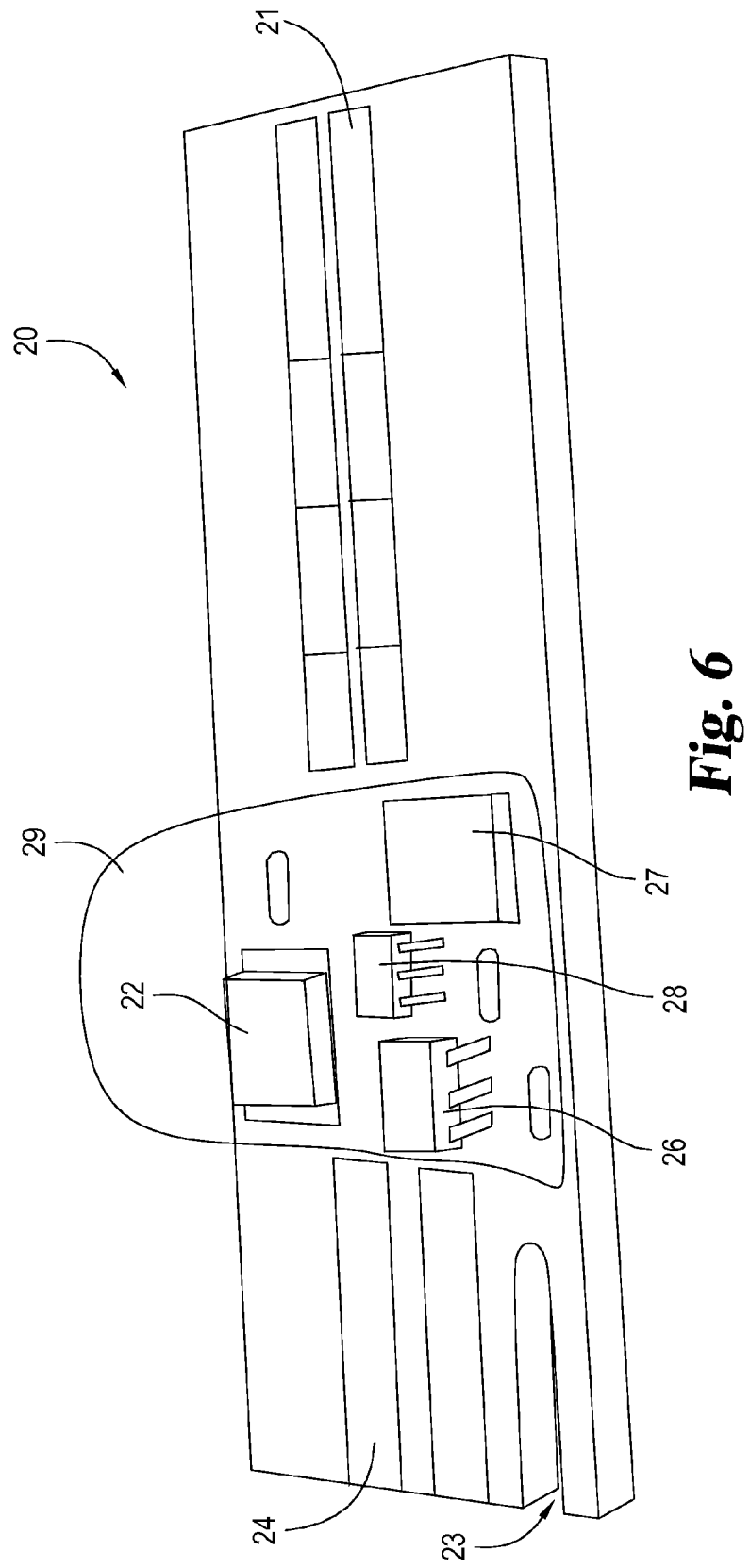
FIG. 6 is perspective view of the test probe assembly of one embodiment of the present invention.

FIG. 6 is perspective view of the test probe assembly of one embodiment of the present invention. The illustrated test probe assembly 20 includes test probe traces 21, test probe capacitor 22, test probe "keys" (cut-outs) 22 at the connector end, test probe connectors 24, flex circuit connector 25, integrated circuit 26, test probe dual flat no lead 27, and power control circuit 28. In the illustrated embodiment the resistance to square wave circuitry includes component grouping 29, which includes capacitor 22, integrated circuit 26, and dual flat no lead 27.

As previously indicated, the resistance to square wave circuitry converts the analog resistance measurement to a digital square wave frequency at the test sample. This allows information relating to current leakage between the test traces to travel more efficiently so that it's easier to transmit to the control electronics. The resistance to square wave circuit converts the amount of leakage current into a square wave of varying period.

The spacing between the traces is preferably the spacing that the sensor is designed to test, such as the fine-pitch spacing of an electronic circuit. In the most preferred embodiments the spacing is between 5 mils (0.005 inch) and 50 mils (0.050 inch), with spacing of about 5 mils, 10 mils, 15 mils, 20 mils, 25 mils, 30 mils, 35 mils, 40 mils, 45 mils, or about 50 mils being provided by one or more of the test circuits. In some embodiments the device includes multiple test circuit boards, with different spacing being used on different test boards. Accordingly, the device may monitor circuit board failure for a range of trace spacing rather than simply for a single spacing.

It is to be appreciated that there is no limit to the spacing that can be monitored with the inventive sensor. Accordingly, trace spacings of less than 5 mils or more than 50 mils may be used if desired.

Additionally, test boards may be provided with different metallization and/or different surface treatments. Such test boards may have traces with different spacings, or they may have traces with the same spacing but with different metallization and/or different surface treatments.

Figure 7:
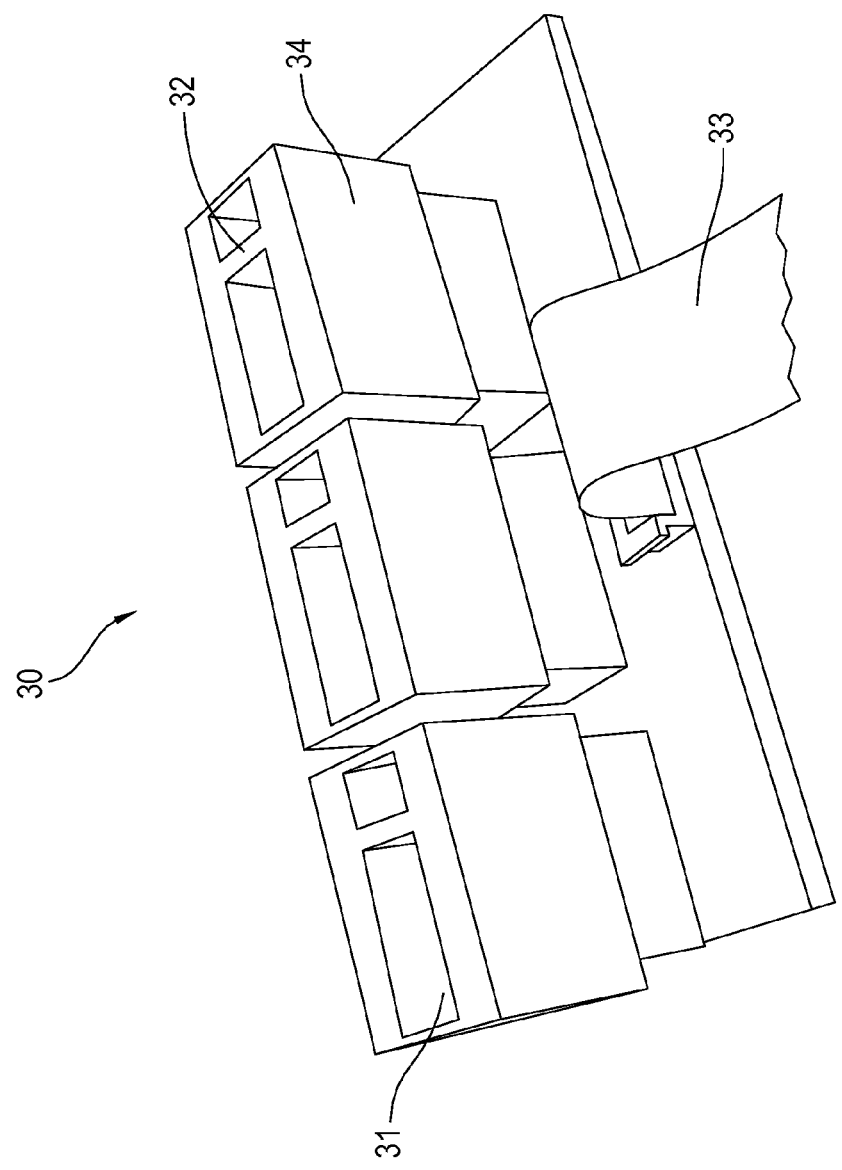
FIG. 7 is perspective view of the probe socket/connector assembly of one embodiment of the present invention.

FIG. 7 is perspective view of the probe socket/connector assembly of one embodiment of the present invention. The illustrated probe socket/connector assembly 30 includes slots 31 for receiving a test probe, tabs 32 for assuring that the probes are inserted correctly, flex circuit connector 33, and socket body 34.

Figure 8:
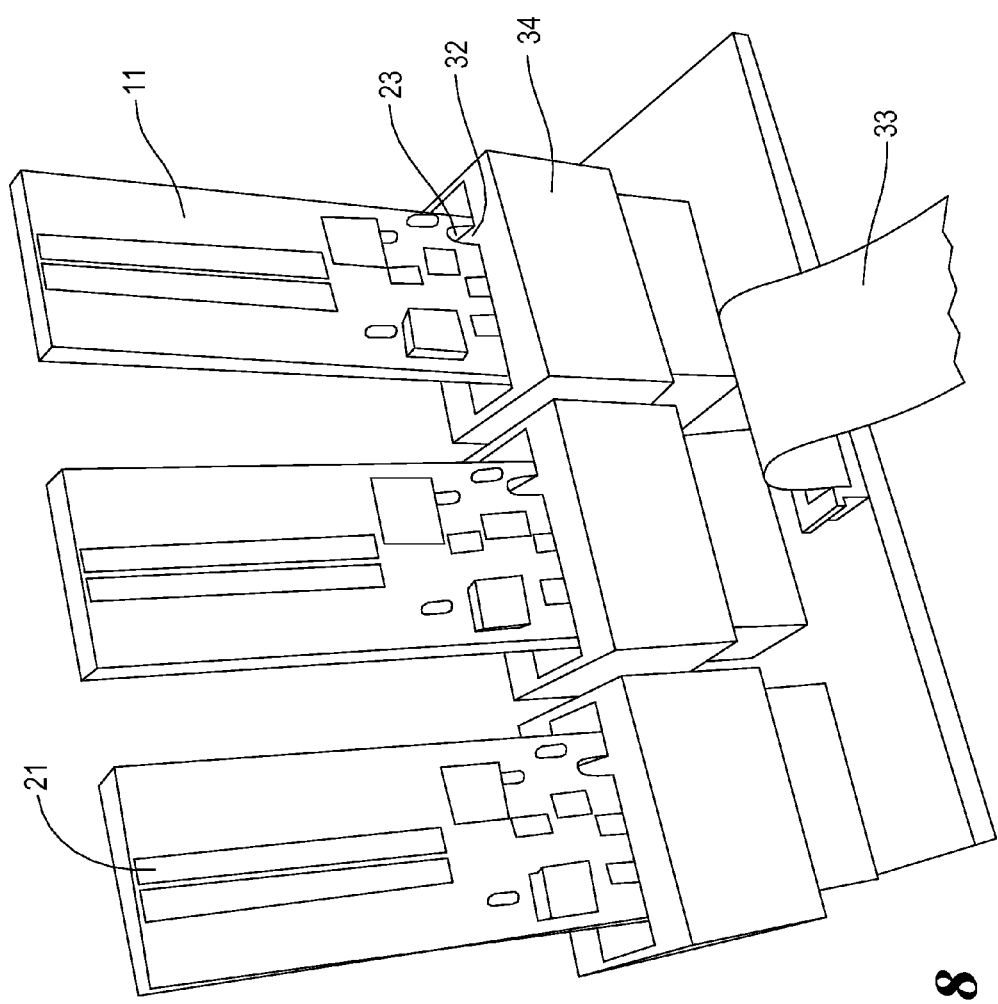
FIG. 8 is perspective view of the probe socket/connector assembly with test probes inserted therein, according to one embodiment of the present invention.

FIG. 8 is perspective view of the probe socket/connector assembly with test probes inserted therein, according to one embodiment of the present invention. Here too, the illustrated assembly includes test probes 11 inserted into slots 31 such that tabs 32 are received in slots 23.

Figure 9:
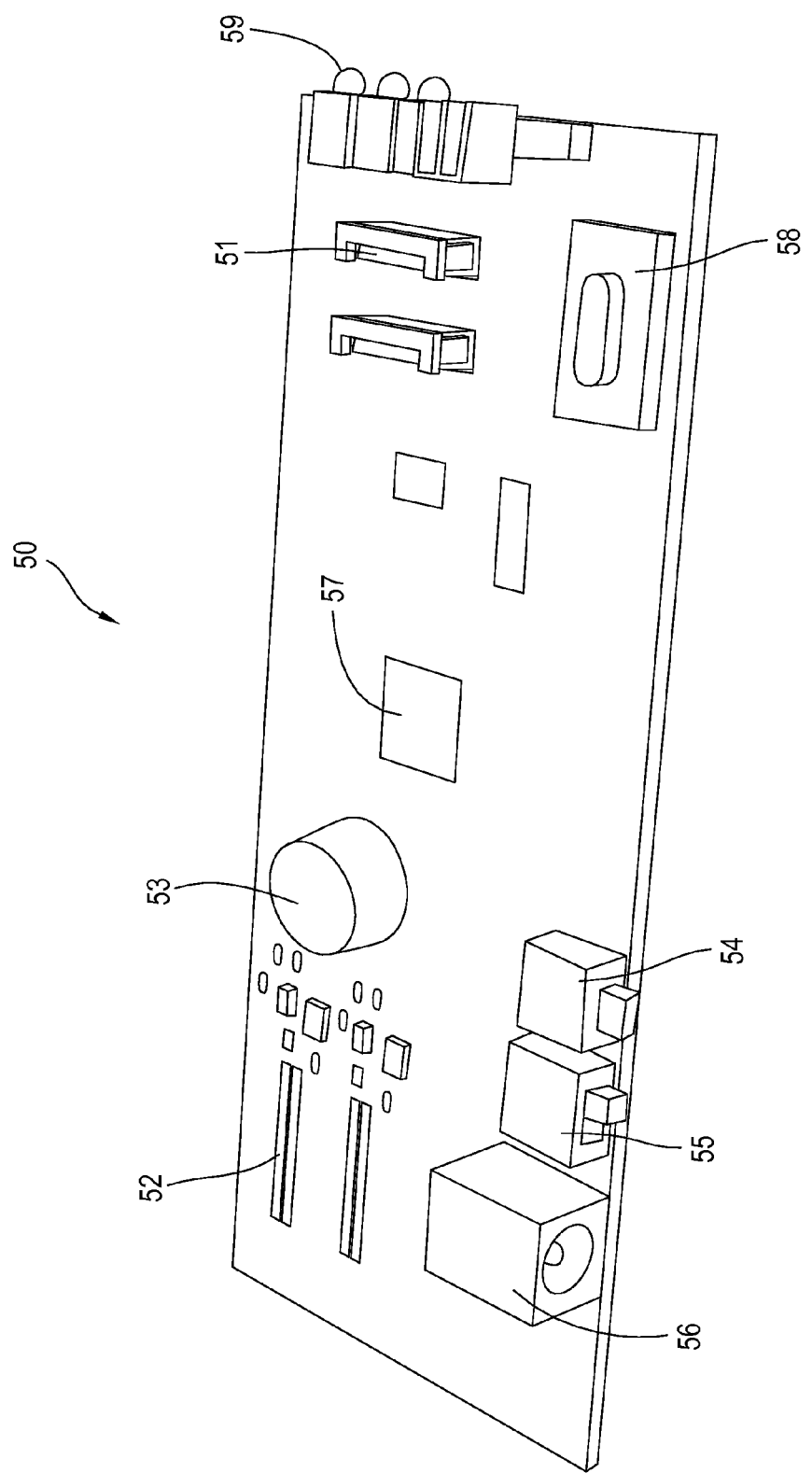
FIG. 9 is perspective view of the main circuit board of one embodiment of the present invention.

FIG. 9 is perspective view of the main circuit board of one embodiment of the present invention. The illustrated main board assembly 50 includes flex circuit connector sockets 51, base probe traces 52, connector 53, programming connector 54, usb interface 55, power connector 56, integrated circuit 57, fan connector 58, and signal lights 59.

Figure 10:
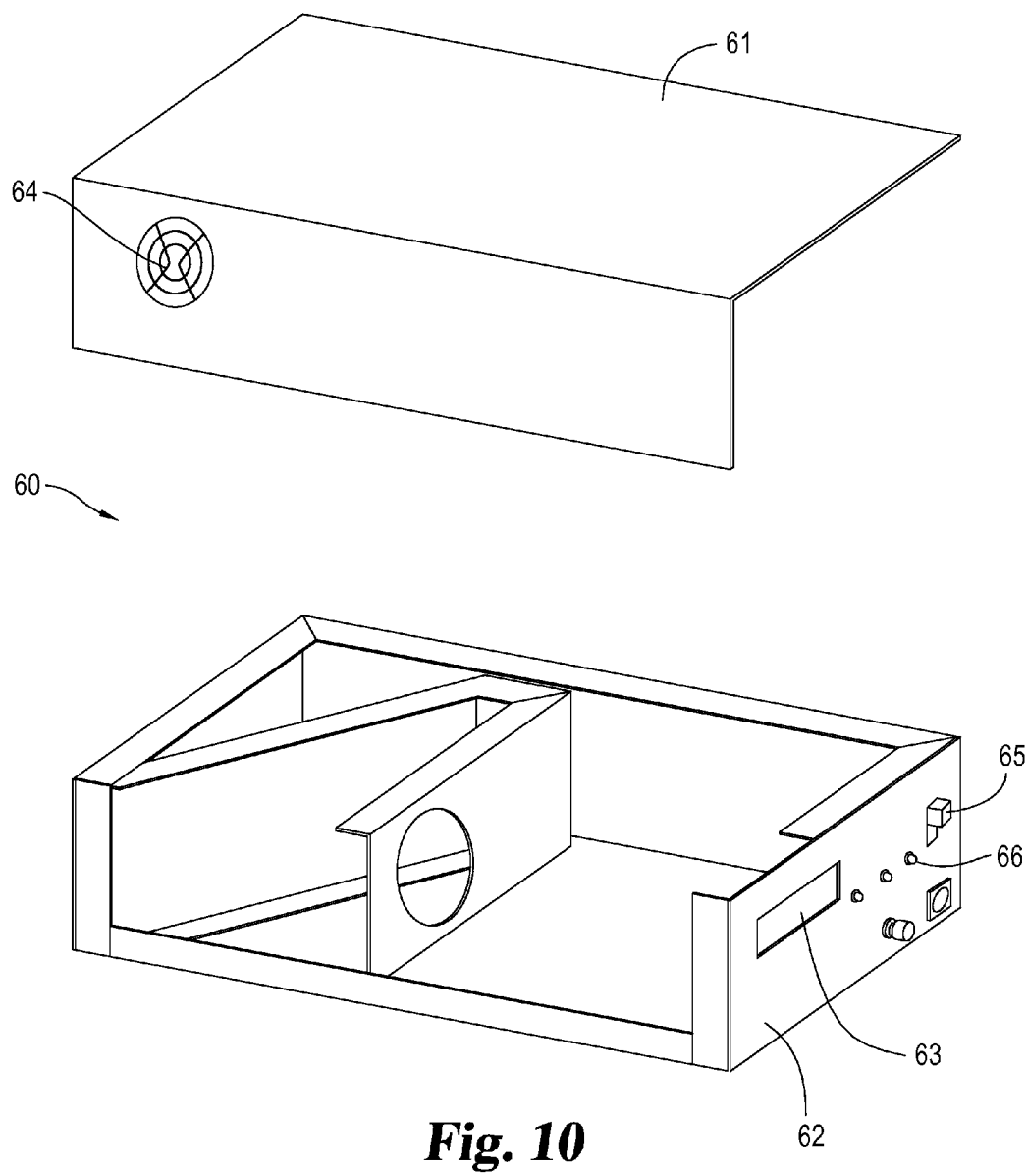
FIGS. 10 and 11 are perspective views of the housing of one embodiment of the present invention.
Figure 11:
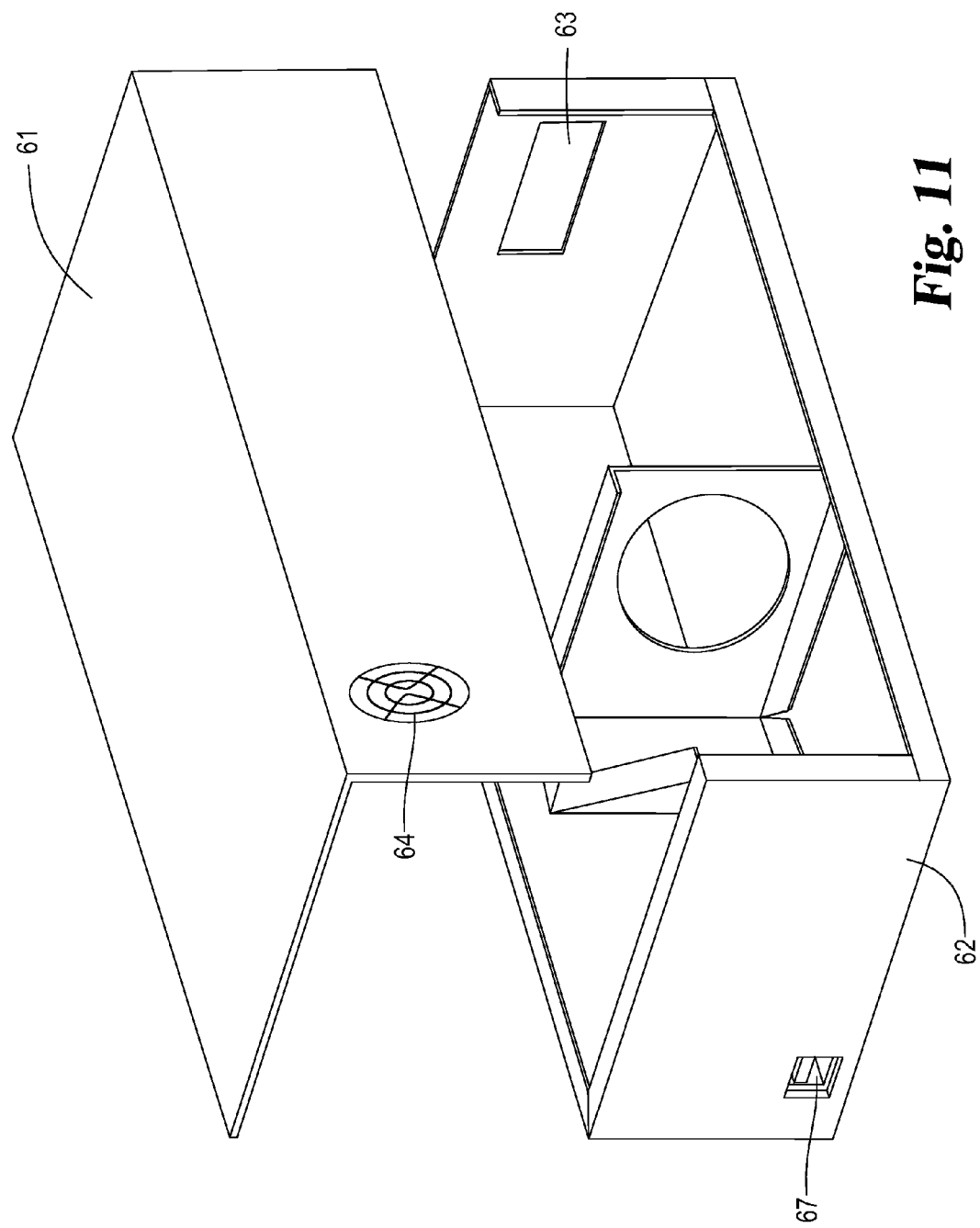

FIGS. 10 and 11 are perspective views of the housing of one embodiment of the present invention. The illustrated housing assembly 60 includes housing top 61, housing bottom 62, housing airflow intake opening 63, and housing airflow output opening 64. Power switch 65 and status indicators 66 are also illustrated in FIG. 10. Connector 67 to an external device (e.g., USB) is also illustrated in FIG. 11.

In addition to the above, other miscellaneous components may include battery 71, antenna 72, and solar panels 73.

The environmental sensor of the present invention may detect when the environment is corrosive to circuit boards such as copper circuit boards or boards plated with Cu, Sn, Ag, Au, or another material. Typically, the sensor measures corrosion caused by $H_2SO_4$, $Cl_2$, moisture, $N_2$, amines, etc. over time.

The inventive method may comprise providing a test probe board substantially as described above, placing the sensor in an environment to be tested, using the fan to blow or draw air across the test board(s), and observing when the test probe fails.

In another embodiment the inventive device is used such that the control electronics are built using manufacturing processes to be certified, whereby the reliability of the control electronics, as built, is tested simultaneously with the environment.

For the purposes of this written description the term "processed" circuit boards includes, but is not limited to, boards that are manufactured, or built, or assembled, or treated, or any combination of those actions, using pre-selected components, or materials, or methods, or any combination of those components, materials and methods.

It is to be appreciated that this written description has referred to the test probe as comprising a pair of traces and circuitry effective for determining the electrical resistance between said traces. However, there may be more than two traces on a test probe, and there may be more than one pair of traces on a test probe. The circuitry effective for determining the electrical resistance between two traces of a trace pair may be adapted to determine the electrical resistance between any pair of the traces, but need not be adapted to determine the electrical resistance between every potential pair of traces.

In view of the above, it can be seen that one aspect of the present invention provides a device for monitoring an environment in which electronic circuit boards are located, said device comprising:
    a) a test board comprising a contaminant collector positioned in a fan air path, said contaminant collector comprising an electrical test circuit with test traces that are spaced a test distance apart, wherein said test distance is between 5 mils and 50 mils; and
    b) a fan for blowing or drawing environmental air in a fan air path;
    c) control circuitry for controlling the application of a voltage to the test traces and for detecting current flowing between the test traces when said voltage is applied; and
    f) a housing for holding and/or containing said fan, said test board, and said control circuitry.

Another aspect of the present invention provides a method for detecting whether an environment will contribute to the failure of electronic circuit boards, comprising the steps of:
    a) providing a test device, comprising:
        i) a test board comprising a contaminant collector positioned in a fan air path, said contaminant collector comprising an electrical test circuit with test traces that are spaced a test distance apart, wherein said test distance is between 5 mils and 50 mils; and
        ii) a fan for blowing or drawing environmental air in a fan air path;

iii) control circuitry for controlling the application of a voltage to the test traces and for detecting current flowing between the test traces when said voltage is applied; and iv) a housing for holding and/or containing said fan, said test board, and said control circuitry.

b) using said fan to draw or blow air over the test circuit;

c) powering the traces of the test circuit;

d) detecting leakage between the test traces;

e) activating a signal indicating the leakage.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected. In addition, it is to be appreciated that the present invention may comprise or consist essentially of any or all of the elements illustrated or described herein. For example, the present invention includes devices comprising each of the embodiments illustrated in FIGS. 1 through 11, and the present invention includes devices consisting essentially of any of the embodiments illustrated in FIGS. 1 through 11. Additionally, it is to be appreciated that the present invention may comprise or consist essentially of any or all of the elements illustrated or described in U.S. Provisional Application No. 61/732,968 (which has been incorporated herein by reference), and/or may comprise or consist essentially of any or all of the elements illustrated or described herein in combination with any or all of the elements illustrated or described in U.S. Provisional Application No. 61/732,968.

The invention claimed is:

1. A method for evaluating the effects of environmental air on a processed circuit board, the method comprising:

a) providing a test probe comprising a circuit board processed by a method to be evaluated, wherein the test probe comprises a pair of traces and circuitry effective for determining an electrical resistance between said traces, wherein the traces are separated by a test distance;

b) measuring the electrical resistance between the two traces of said test probe at a first test probe measurement time prior to exposure of the test probe to environmental air to be tested;

c) communicating information including the measured electrical resistance between the two traces of said test probe as measured at said first time to a device that stores data, or analyzes data, or stores and analyzes data;

d) confirming that the measured electrical resistance between the two traces of said test probe as measured at said first time is at an acceptable level as defined by a pre-determined acceptance standard;

e) exposing the test probe to the environmental air to be tested;

f) making one or more subsequent measurements of the electrical resistance between the two traces of said test probe after exposure of the test probe to environmental air;

g) communicating information including the one or more subsequent measurements to the device that stores data, or analyzes data, or stores and analyzes data; and h) determining when the one or more subsequent measurements of electrical resistance between the two traces of said test probe changes to an unacceptable level as defined by the pre-determined acceptance standard.

2. The method of claim 1 and further comprising the step of evaluating changes in the electrical resistance between the two test probe traces over an exposure period.

3. The method of claim 1 wherein the test probe is provided in a device for evaluating the effects of exposure to an environmental air on a processed circuit board, wherein said device comprises:

a) a test probe socket for receiving said test probe and for connecting said test probe to a device that stores data, or analyzes data, or stores and analyzes data;

b) a substantially enclosed pathway for directing environmental air across the traces of said test probe;

c) a fan for blowing environmental air through said pathway and across said test probe;

d) a control element for controlling a fan to selectively blow or not blow air through said pathway and across said test probe;

e) a control element for controlling power applied to one or more of the test probe traces;

f) data storage for storing data relating to measured electrical resistance between the test probe traces;

g) data storage for storing data relating to acceptable electrical resistance between test probe traces;

h) circuitry for comparing a measured electrical resistance between two test probe traces to a stored value for the acceptable electrical resistance between two test probe traces; and i) an output for communicating the results of the comparison between the measured electrical resistance between two test probe traces and the stored value for the acceptable electrical resistance between two test probe traces.

4. The method of claim 3 wherein the test probe further includes a resistance to square wave converter to convert a measured electrical resistance to digital output data representing the measured resistance.

5. The method of claim 3 wherein the test probe includes a connection end with a keyed connector that is inserted into said test probe socket in an orientation that allows proper communication between the test probe and the control element for controlling power applied to one or more of the test probe traces.

6. The method of claim 3 wherein the test probe is provided in a device that also includes a second circuit board processed by a method to be evaluated, wherein the second circuit board comprises a pair of traces and circuitry effective for determining the electrical resistance between said traces, wherein the traces are separated by a test distance, and wherein the second circuit board is located at a location that is remote from said pathway for directing environmental air across the traces of said test probe; and wherein the method further includes the steps of:

i) measuring an electrical resistance between the two traces of the second circuit board at a first second circuit board measurement time, wherein said first second circuit board measurement time is the same time or a different time than the first test probe measurement time;

ii) communicating information including the measured electrical resistance between the two traces of the second circuit board as measured at said first second circuit board measurement time to the device that stores data, or analyzes data, or stores and analyzes data;

iii) confirming that the measured electrical resistance between the two traces of the second circuit board as measured at said first second circuit board measurement time is at an acceptable level as defined by the pre-determined acceptance standard;
iv) making one or more subsequent measurements of the electrical resistance between the two traces of the second circuit board;
v) communicating information including the one or more subsequent measurements to the device that stores data, or analyzes data, or stores and analyzes data; and
vi) using the measured electrical resistance between the two traces of said second circuit board as a baseline for determining a length of time that the resistance between two traces of a circuit board is expected to remain at an acceptable level, as defined by the pre-determined acceptance standard, when the circuit board is not exposed to a flow of environmental air.

* * * * *